(12) United States Patent
Kostrzewa et al.

(10) Patent No.: US 7,947,564 B2
(45) Date of Patent: May 24, 2011

(54) METHOD OF FABRICATING A MIXED MICROTECHNOLOGY STRUCTURE AND A STRUCTURE OBTAINED THEREBY

(75) Inventors: Marek Kostrzewa, Grenoble (FR); Hubert Moriceau, Saint-Egreve (FR); Marc Zussy, Saint-Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 205 days.

(21) Appl. No.: 11/857,130

(22) Filed: Sep. 18, 2007

(65) Prior Publication Data

US 2008/0079123 A1 Apr. 3, 2008

(51) Int. Cl.
*H01L 21/76* (2006.01)
(52) U.S. Cl. .............. 438/406; 438/458; 257/E21.122
(58) Field of Classification Search .................. 438/405, 438/406, 456–459; 257/E21.12, E21.122, 257/E21.123
See application file for complete search history.

(56) References Cited

U.S. PATENT DOCUMENTS

| | | | | |
|---|---|---|---|---|
| 2004/0009649 A1 * | 1/2004 | Kub et al. | ..................... | 438/459 |
| 2004/0087147 A1 * | 5/2004 | Lavric et al. | .................. | 438/687 |

\* cited by examiner

*Primary Examiner* — Thanhha Pham
(74) *Attorney, Agent, or Firm* — Brinks Hofer Gilson & Lione (57) ABSTRACT

A method of fabricating a mixed microtechnology structure includes providing a provisional substrate including a sacrificial layer on which is formed a mixed layer including at least first patterns of a first material and second patterns of a second material different from the first material, where the first and second patterns reside adjacent the sacrificial layer. The sacrificial layer is removed exposing a mixed surface of the mixed layer, the mixed surface including portions of the first patterns and portions of the second patterns. A continuous is formed covering layer of a third material on the mixed surface by direct bonding.

28 Claims, 2 Drawing Sheets

METHOD OF FABRICATING A MIXED MICROTECHNOLOGY STRUCTURE AND A STRUCTURE OBTAINED THEREBY

PRIORITY CLAIM

This application claims priority to French Patent Application No. 0653820, filed Sep. 19, 2006.

TECHNICAL FIELD

The invention concerns the fabrication of a mixed microtechnological structure, that is to say a substrate (or a set of substrates and/or layers) produced by means used conventionally in microelectronics and being able to include in particular microelectronic and/or optical and/or mechanical components.

BACKGROUND

A huge growth in integrated circuits that are no longer simple electronic circuits has been observed over the past ten years or so: it is predicted that these new integrated circuits, which are already under development, will contain optical functions, high-frequency functions, and even molecular and bio-electronic functions (the term SOC (System On Chip) is often used). However, there are numerous applications in which it is difficult or even possible to produce all the circuits or components providing these various functions on the same homogeneous microtechnological substrate by a single string of technological steps.

A simple solution has consisted in fabricating the components on separate substrates and then assembling them one by one onto the same substrate forming a support by bonding using an additional material, for example a metallic or epoxy material, using the overturning technique known as "flip-chip", and the like. This solution is satisfactory for a certain number of applications but in particular does not allow for the miniaturization of large scale integrated circuits.

Another solution has consisted in providing substrates that are no longer homogeneous but feature areas having different properties enabling the production of different components. This explains why, for certain applications, and more particularly for the integration into a structure of so-called "vertical" components conjointly with components that are totally insulated, it has been proposed to produce a mixed substrate (or "patterned" substrate, that is to say a substrate having a buried mixed layer featuring patterns of different materials), that is to say a substrate in which two types of areas co-exist: 1) areas having the properties of a bulk material between the faces of the substrate (for the "vertical" components), and 2) SOI (Silicon On Insulator) type areas, i.e. areas including silicon on top of an insulator such as an oxide).

The bulk materials provide better electrical conduction (between the front face and the rear face of the substrate) as well as, given the absence of any significant thermal barrier, better thermal conductivity (whence better dissipation of heat) than SOI type areas or substrates. They are therefore entirely appropriate in particular for the fabrication of "vertical" components (in particular power components).

SOI areas, on the other hand, have the advantage of enabling the production of totally insulated components (such as fully depleted MOS transistors) and other microelectronic components (in particular logic circuits), for example.

These mixed substrates in theory have numerous advantages, for numerous applications, among which there may be cited in particular:

1) integration of DRAM memories onto a substrate including SOI areas (the dynamic operation of DRAM memories on an SOI substrate is disturbed by the floating potential of that SOI substrate, and so it is preferable to produce these memories in bulk areas alongside SOI areas), 2) integration of power components on SOI (the integration of components on SOI substrates is not possible because of the architecture of these components (this is the case in particular of VDMOS (Vertical Double-diffused Metal Oxide Semiconductor) components), especially as the layer of insulator of an SOI substrate would be a thermal barrier that would prevent sufficient dissipation of the heat generated at the core of the component), and 3) integration of MEMS and new component architectures for the fabrication of sensors, opto-electronic circuits, and the like.

In fact, these mixed substrates can be produced by oxidation of buried layers or by formation of oxide patterns on the surface of a substrate to which another substrate is subsequently bonded.

Direct bonding (often referred to as molecular bonding) is particularly suitable for this purpose, since this type of bonding is in theory capable of providing very high mechanical strength, high thermal conductivity, a uniform thickness of the bonding interface, etc. This type of bonding is effected without additional material (thus without adhesive). Simple surface preparation can in theory suffice to achieve such bonding (it can nevertheless be difficult), even at room temperature. The bringing of the surfaces to be bonded into contact is generally followed by a strengthening (or consolidating) heat treatment.

More precisely, it is known that direct bonding enables thin layers to be transferred onto a substrate. One of the key steps during such transfer of a thin layer onto a substrate is in practice the couple comprising (bringing the surfaces into contact)+(heat treatment to strengthen the bonding interface). In effect, during this heat treatment, bonding defects can appear in the form of areas that have not bonded: these defects can be reflected, for example, in the appearance of native oxide precipitates and/or gas molecules trapped upon bringing into contact the two wafers (namely the layer and the substrate), which can be of silicon (or another material).

It is to be noted that, according to PCT Publication No. WO-2004/059711 (Fournel et al.) concerning the production of mixed structures, the presence of oxide areas at the bonding interface can serve to trap impurities and adsorb them during the heat treatment to consolidate the bonding.

It is as well to note here that, for certain applications, the requirement may be to transfer a layer of silicon onto a silicon substrate via a thin oxide layer rather than directly. According to the document PCT Publication No. WO-2004/059711 cited above, during the heat treatment, the impurities trapped when bringing the wafers into contact can be adsorbed by the oxide layer. Nevertheless, if that layer is very thin, it cannot adsorb all the various impurities, and bonding defects occur anyway in the form of areas that have not bonded. On the other hand, it is clear that the co-existence in a substrate of SOI type areas having different oxide thicknesses could solve the problem of outgassing the impurities, by increasing the thickness of the oxide layer where that is not a problem for the components. This corresponds to another type of mixed structure.

It is therefore clear that it could be of benefit to know how to produce, in particular, two types of "patterned" or mixed structures (or substrates): 1) partial SOI substrate (co-existence of SOI areas and bulk areas), 2) mixed SOI substrate (co-existence of two types of SOI areas, with different buried oxide thicknesses).

In fact, these two types differ in the presence or absence of a continuous oxide layer between the upper and lower portions of the structure.

It is furthermore clear that there could be a benefit in being able to modify other characteristics of the mixed substrate described hereinabove: 1) the possibility of employing different materials (thermal and/or deposited $SiO_2$, $Si_3N_4$, $Al_2O_3$, AlN and other insulative materials) as buried insulation; and 2) the possibility of using other materials (Si, but also SiGe, GaAs, GaN, InP and other materials) on either side of the continuous or non-continuous buried insulation layer, in particular for the transferred layer and for the substrate to which that layer is bonded (if the structure is obtained by direct bonding).

More generally, it can be of benefit to obtain a mixed structure, i.e. one having a buried layer made up of areas of different materials enabling local modification of the electrical and/or thermal and/or mechanical and/or optical and/or chemical properties of the structure.

As indicated hereinabove, different technologies exist for producing mixed or partial SOI, in particular by oxidation of a substrate below the surface or by bonding (in practice direct bonding) of a plurality of layers or substrates.

Local Implantation SIMOX Technology

The SIMOX (Separation by IMplantation of OXygen) process is known for its simplicity in the production of SOI substrates. In order to obtain an SOI substrate, a very high dose of oxygen is implanted below the "upper" surface of a silicon wafer (or substrate), after which the combination is annealed at a high temperature to convert the region implanted with oxygen into silicon dioxide $SiO_2$.

This technology can enable the production of mixed substrates: using the known techniques of masking and lithography, it is in effect possible to implant the oxygen ions in a localized manner, and thus to create localized underlying oxide layers (see U.S. Patent Publication No. 2006/0040476, U.S. Pat. No. 6,846,727 or the paper "Fabrication of High Quality Patterned SOI Materials by Optimized Low-Dose SIMOX", Dong et al., pages 60-61, "2004 IEEE International SOI Conference 2004").

The fabrication of a patterned substrate (or structure) using the SIMOX process thus consists in:

1) depositing a hard mask on a substrate,
2) opening implantation windows in that mask (by lithographic means),
3) implanting oxygen ions through these windows,
4) carrying out an oxidation annealing in order to form localized buried oxide areas, and
5) eliminating the mask.

This process nevertheless has limitations in terms of choice of materials and cannot produce hybrid structures (germanium on silicon, GaN on silicon, silicon on glass, and the like) or in terms of crystallographic structure (for example amorphous layers). In fact, only the formation of silicon dioxide has been thoroughly investigated, although tests with implantation of nitrogen have verified the formation of silicon nitride.

This approach also has various drawbacks or problems:

1) limited choice of oxide: $SiO_2$ by implantation of oxygen and SiN by implantation of nitrogen, whereas many other materials may be desirable,
2) limited choice of material for the whole of the structure in which the insulative patterns are formed (silicon, in practice),
3) surface deformation after implantation and after oxidation annealing (oxidation implies a local increase in the volume of the areas in which oxygen combines with silicon, and consequently "surface swelling"),
4) presence of transitions between SOI areas and bulk areas featuring a high density of defects, and
5) great difficulty in obtaining in a controlled manner mixed SOI type structures (such as SOI type substrates with an oxide layer the thickness whereof varies from one area to another).

Another, more exploratory approach has been proposed by Terada et al. ("A New DRAM Cell with a Transistor on a Lateral Epitaxial Silicon Layer (TOLE Cell)", pages 2052-2057, in IEEE Transactions on Electron Devices Vol 37, No. 7, September 1990). According to that document, a thermal oxide layer is formed on a silicon substrate; lithographic process steps are carried out in order to etch the oxide layer locally; lateral epitaxial regrowth is then effected; a final polishing removes the silicon and planarizes the surface. However, the choice of materials for producing this structure is limited (to enable the compatibility necessary for epitaxial regrowth). The thicknesses employed are also limited, especially if the structure is heterogeneous.

Mixed or Partial SOI Substrates Obtained by Direct Bonding

The principle of producing mixed structures by direct bonding is described in particular in the PCT Publication No. WO-2004/059711 cited above, but also in U.S. Pat. No. 5,691,231 the preamble whereof describes various known solutions, or in the chapter "Dielectric Isolation Technologies and Power ICs" by Y. Sugawara in "Smart Power ICs" by Muvavi, Bevotti and Vignola.

The first step is to create a cavity in a silicon substrate and then to oxidize the whole of the surface. Chemical mechanical polishing (CMP) removes a portion of the oxide and exposes both Si areas and $SiO_2$ areas, so as to obtain a mixed surface. After chemical cleaning, another silicon substrate is bonded to this mixed surface and then thinned, which yields the required mixed substrate. Trenches can then be formed to complete the insulation of an area of substrate along the local insulation layer.

In a variant referred to by Sugawara (see above), a doped area can be formed (by implantation) at the bottom of the cavity before filling it by oxidation.

These approaches run into a major problem that is linked to the polishing of the mixed surface formed by the mixed $Si/SiO_2$ areas: the conjoint presence of Si and $SiO_2$ areas coexisting on the surface makes planarization of the surface to enable good direct bonding difficult, although it is clear that, in all cases where direct bonding is required, flatness is essential and that the quality of polishing is critical.

Now, at present there is no method for polishing a mixed surface having both silicon areas and silicon oxide areas enabling a compatible surface (in particular in terms of flatness, roughness and homogeneous hydrophilic character) to be obtained compatible with direct bonding of good quality.

In general, the speed of polishing silicon oxide is lower than that of polishing silicon. A phenomenon known as "dishing" then occurs, corresponding to the formation of a negative difference in level (suggestive of a dish) in the region of the silicon areas. Positive differences in level can also persist on the surface (small bumps are obtained), for example linked to defective polishing. This negative or positive difference in level can reach tens of nanometers, as a function in particular of the polishing conditions and the size of the oxide and/or silicon areas. In both cases, the surface irregularities can prevent direct bonding of very good quality and the production yield of such bonded assemblies can be very low.

Moriceau et al., in the paper "Transfer of patterned Si and SiO2 layers for the fabrication of Patterned and Mixed SOI", pp 203-204, 2004 IEEE International SOI Conference, 10/04, commented on this polishing problem whilst stating that it was possible to solve the difference in level problem, relatively unimportant on the sub-micron scale but routinely observed in the case of patterns having dimensions of the order of one micron or even of one millimeter, by optimizing the polishing processes for each mixed substrate configuration (distribution of the patterns formed by the areas, size of areas, thickness of oxide, and the like). However, this implies that it is not always possible to avoid these polishing problems if the various parameters mentioned above cannot be modified.

For the fabrication of a mixed structure including a vertical component and its control circuit, Hiromasa et al., in Japanese Patent No. JP-08-330554, teach setting back the silicon oxide layer in the cavity relative to the silicon surface, noting that this way there are no bonding defects in the area of the vertical component. However, it is clear that with this approach the bonding interface is not continuous, so that gas molecules can be trapped after bringing the two wafers into contact. This has the drawback that these molecules can lead to partial and unintentional separation of the transferred layer. The lack of continuity also leads to a low thermal conductivity of the assembly.

To get around the impact of differences in level created when polishing on the quality of the bonding of a mixed structure, U.S. Pat. No. 5,691,231 cited above proposes using a polycrystalline silicon layer after the formation of an oxide. Initially, cavities filled with oxide are formed on the surface of a silicon substrate. The whole is then polished. A polysilicon layer is then deposited on the planarized mixed surface and then polished. Another substrate is bonded to it, after which the original substrate is thinned to the required final thickness (typically a few microns).

It is possible with this approach to use silicon substrates having different properties (in terms of doping, for example). These layers nevertheless remain separated by a polysilicon layer, which can be a problem for certain applications.

Another solution relating to direct bonding is also referred to in the document cited above by Sugawara (proposed by Ohata et al. in Tech of IEEE Costume IC Conference, p 443 (1986)). In that approach, a lithographic mask is deposited on an SOI type substrate after a direct bonding step; the upper layer of silicon, the oxide and the solid silicon substrate (in part) are then etched to form a cavity. Epitaxial regrowth of silicon is then effected, with a thickness greater than the thickness of the cavity. Given that the epitaxial regrowth also occurs on the upper layer of silicon, CMP polishing is effected in order to eliminate this overthickness formed on the SOI area. It is nevertheless clear that this technology is complex and of limited application.

Given the state of the art described hereinabove, it is clear that there is no "universal" approach for producing mixed or "patterned" substrates, such as substrates having a buried mixed layer with patterns of different materials and in particular one of which at least is a crystalline material, offering the following performance:

1) the possibility of placing different materials at the same level as, above and below this mixed layer, 2) the possibility of managing different thicknesses (and more particularly the possibility of obtaining thin layers), and 3) the possibility of producing micrometric and millimetric patterns at the same time on the same substrate.

SUMMARY

To this end the invention proposes a method of fabricating a mixed microtechnology structure, where a provisional substrate is produced including a sacrificial layer and a mixed layer adjacent to the sacrificial layer and including at least first patterns of a first material and second patterns of a second material different from the first material. This sacrificial layer is removed to bare a mixed surface of said mixed layer, that mixed surface including portions of the first patterns and portions of the second patterns, and there is produced on this mixed surface, by direct bonding, a continuous covering layer of a third material.

Thus the invention proposes to use an etch stop sacrificial layer (for example of Si3N4 or other material) during the fabrication of a patterned substrate. This layer eliminates the polishing step or at least eliminates the difference in level effect and thus enables very good bonding at the mixed surface that is bared when the sacrificial layer is removed.

According to preferred features of the invention, where applicable in combination: at least one of the first and second materials is monocrystalline; the first material is electrically non-insulative; the second material is electrically insulative; the third material is electrically non-insulative; and the first patterns and the continuous covering layer contain the same element, which is particularly simple, although these materials can instead be different, according to what is required. Thus it can be a question of silicon or other elements (for example germanium, SiGe alloys, (III-V) alloys such as AsGa, and other elements useful in the field of microtechnologies). The continuous covering layer and the first patterns contain different dopings, in identical or different materials (see above). The second patterns are of oxide, which is a type of insulation whose production process is well proven. The second patterns advantageously contain an oxide of an element contained in the first patterns, which in particular guarantees good chemical compatibility. This oxide is advantageously an oxide of silicon, for example, the sacrificial layer is a nitride, which is also a compound whose production process is well proven. The sacrificial layer and the second patterns preferably respectively include a nitride and an oxide of the same element that the first patterns of the mixed layer include. The covering layer is of the same material as the first patterns; the first patterns are of silicon (although many other elements useful in microtechnology can be used).

Before producing the continuous covering layer on the mixed surface, there is formed on that mixed surface or on that continuous covering layer an insulative interface layer. This produces a mixed microtechnology structure of the mixed SOI type. The insulative interface layer is advantageously formed by surface oxidation of the continuous covering layer. It is even more preferable if the insulative interface layer and the second patterns are formed of oxides of the same element. It is particularly beneficial, for example, if the first patterns are of silicon and the oxides of the insulative interface layer and the second patterns are oxides of silicon.

The provisional substrate is advantageously produced from a starting substrate including the sacrificial layer and a continuous preliminary layer formed of the first material by the following steps:

1) cavities are hollowed lithographically in this preliminary layer from a face of this layer that is opposite the sacrificial layer, these cavities extending as far as the sacrificial layer, 2) these cavities are filled with a second material to form the second patterns and to obtain a mixed surface, this preliminary layer having become said mixed layer, 3) there is formed on this mixed surface a layer of planarization material, 4) this layer of planarization material is polished to have a continuous plane surface, and 5) there is assembled to this preliminary layer, covered with said planarization layer, a support substrate of a fourth material, that support substrate having a surface direct bonded to the continuous plane surface of the planarization layer.

According to preferred features of this particular aspect of the invention, where applicable, in combination, the starting substrate further includes an intermediate support substrate, which facilitates manipulation. The starting substrate advantageously further includes an insulative layer between the intermediate support substrate and the sacrificial layer, which can facilitate the subsequent elimination of this sacrificial layer, for example, this insulative layer is preferably an oxide of an element of the intermediate support substrate layer, for example SiO2;

There is a step of implantation of this intermediate support substrate with gaseous species or ions with a view to forming in this intermediate support substrate a weakened layer along a layer parallel to the sacrificial layer, in this case, after assembling by direct bonding the final support substrate with the preliminary layer, the intermediate support substrate is advantageously caused to separate along the weakened layer. The continuous preliminary layer is obtained by bonding to the sacrificial layer a preliminary substrate separation whereof is caused along a weakened layer. The cavities are filled by vapor deposition, for example, and the mixed surface is obtained by polishing this second material to bare portions of this preliminary layer between cavities. The planarization layer is a polycrystalline layer of a material that the first patterns include, for example, this polycrystalline layer is preferably deposited in vapor form; alternatively the planarization layer is a metallic layer, advantageously deposited by an evaporation or sputtering or vapor phase deposition technique. The final support substrate is of a material that the first patterns include.

The invention further proposes a mixed structure obtained by the above method, in the particular case where the mixed layer is formed by filling cavities obtained lithographically and assembled to a support by means of a planarization layer, that structure being recognizable because it is a mixed microtechnology structure including:

1) a support substrate, 2) a planarization layer adjacent to that support substrate and direct bonded to it, 3) a mixed layer alongside this planarization layer and including first patterns of a first material and second patterns of a second material different from the first material, and 4) a covering layer assembled at least indirectly to this mixed layer by direct bonding.

According to preferred features stemming from those referred to hereinabove the first material is electrically non-insulative, the second material is electrically insulative, the covering layer is connected to the mixed layer via an insulative interface layer, the insulative patterns are of oxide, and there is a doping difference between the second patterns of the mixed layer and the continuous covering layer.

BRIEF DESCRIPTION OF THE DRAWING

Objects, features and advantages of the invention emerge from the following description, given by way of illustrative and nonexhaustive example, and with reference to the drawings in which.

DETAILED DESCRIPTION

In the particular case of FIGS. 1 to 8, the method of the invention includes the following steps: illustrated for certain (nonlimiting) examples of materials:

a) fabrication of a substrate adapted to future requirements including a sacrificial layer 2, for example of nitride disposed between a preliminary layer 1 (advantageously formed of a monocrystalline material, for example silicon) and a starting substrate (which can itself include, on the same side as the sacrificial layer, an insulative layer 3, for example of oxide); the sacrificial layer 2 can advantageously have at its interface with the preliminary layer 1 an etching selectivity relative to that layer; it can equally advantageously have at its interface with the starting substrate an etching selectivity relative to that substrate, b) lithography and selective etching of the preliminary layer 1 as far as the sacrificial layer 2, leaving areas of the preliminary layer known as areas of interest 1A, 1B, 1C, c) filling with a filler layer 5 surface areas situated between the areas of interest 1A, 1B, 1C at least as far as the level of the surface of those areas, advantageously with an insulative material, for example silicon oxide, d) polishing of the surface of the filler layer 5, at least as far as the areas of interest 1A, 1B, 1C, leaving a mixed layer 15 on the sacrificial layer 2, e) depositing on the mixed layer 15 of a thin planarization layer 6 that is advantageously non-insulative, for example of polycrystalline silicon or of metal, and planarization (CMP) of that layer 6, f) bonding to the planarization layer 6 a second wafer 7 (for example of silicon) called the support substrate, g) elimination of the starting substrate and the sacrificial layer 2, baring one face of the mixed layer 15, h) transferring onto the bared face of the mixed layer 15 a thin layer 9B (for example of silicon) called the covering layer.

Alternatively, it is possible, especially if the preliminary layer is of silicon, advantageously covered with a thin nitride layer, to etch locally in the step b) only a portion of the thickness of this preliminary silicon layer, the remaining thickness being thereafter consumed by thermal oxidation. In this case the step c) can become optional if the thermal oxidation is sufficient to fill the surface areas situated between the areas of interest. The thin nitride layer of the preliminary layer could if required be removed selectively, for example after the thermal oxidation step.

In another variant, in the step c), the filler layer 5 filling the surface areas situated between the areas of interest 1A, 1B, 1C need not reach the surface of those areas: in this case, the polishing step d) is of no utility.

Materials are advantageously used for this process that employ highly selective chemical attack to remove the sacrificial layer.

Figure 5:
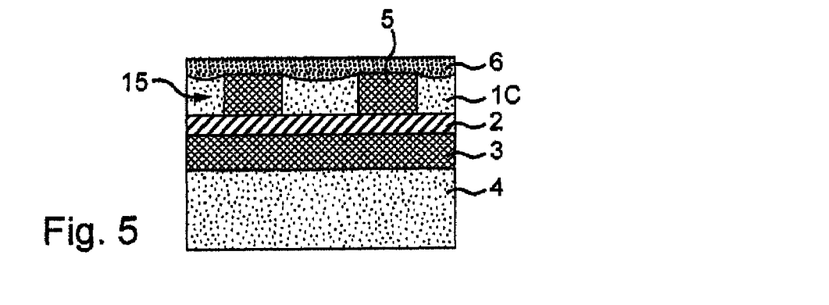
FIG. 5 is a diagrammatic view of a fifth fabrication step, making use of the deposition of a planarization layer, for example of polycrystalline silicon.

The planarization layer 6 "absorbs" the surface topology of the mixed layer 15. That topology may result from the etching step b), filling step c), polishing step d) or other technology steps performed on the whole or part of the mixed layer before depositing this planarization layer and in particular steps aiming to produce components that are subsequently buried.

The process illustrated in FIGS. 1 to 8 and described in outline hereinabove will be described in detail by way of a nonlimiting example for the production of a partial SOI.

Figure 1:
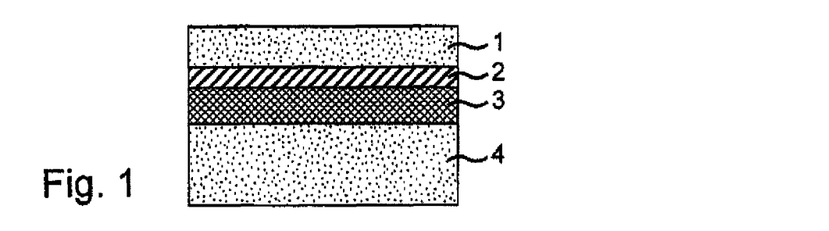
FIG. 1 is a diagrammatic view in section of a first step of fabrication of a structure according to the invention, making use of a starting substrate of silicon, for example.

Fabrication of a substrate including a sacrificial layer (FIG. 1)

In this detailed example this step aims to produce an SOI type substrate including between the buried oxide layer and the thin silicon film a nitride layer (sacrificial layer). A deposit 2 of silicon nitride ($Si_3N_4$) is produced on a bulk silicon preliminary substrate (here situated at the top, and a portion 1 whereof is seen), advantageously of monocrystalline silicon. This nitride layer will serve as a sacrificial layer in the remainder of the process. A number of deposition techniques are known for this purpose (LPCVD, CVD, etc.). Where the present application is concerned, LPCVD (Low Pressure Chemical Vapor Deposition) is preferred as being the most suitable. The preliminary substrate is then subjected to implantation by gaseous species or ions to create a buried weak area delimiting the preliminary thin layer 1 in this wafer. The implantation conditions vary as a function of the thickness of the nitride layer and as a function of the required thickness of the silicon; the implantation doses vary from a few $10^{16}$ to a few $10^{17}$ atoms per $cm^2$, for example, the energy from 30 keV to 200 keV. Alternatively, it is possible to proceed to the implantation step before the deposition of the sacrificial layer.

Figure 2:
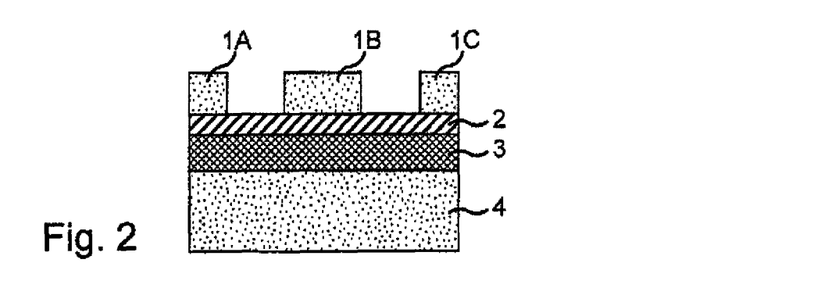
FIG. 2 is a diagrammatic view of a second fabrication step, making use of etching.

Moreover, an insulative layer 3, here of oxide (thermal oxide or deposited oxide), is formed on a substrate 4 referred to as the starting support substrate (here at the bottom), to form a starting substrate. Alternatively, it would be possible to form this oxide layer wholly or partly on the nitride layer of the first wafer. The surfaces to be assembled of the layers 2 and 3 are then prepared for bonding (in particular by appropriate chemical cleaning). They are then bonded by bringing them into intimate contact. High-temperature annealing strengthens the bond between the layers 2 and 3 and fractures the preliminary substrate along its buried weak area to isolate the preliminary layer 1 from the remainder of this preliminary substrate. The surface of the SOI structure obtained in this way is rough after the fracture (upper surface in FIG. 1). The usual finishing processes (including CMP polishing and heat treatment in diverse atmospheres (for example annealing in hydrogen to smooth the silicon)) produce the required final roughness, typically a few tenths of a nanometer rms.

b) Lithography and Selective Etching of the Preliminary Layer (FIG. 2)

During this step, which is well known in itself, a photosensitive resin (not shown) is spread over the substrate (on the upper surface obtained in FIG. 1). That resin is then exposed using appropriate equipment through a mask that contains the required pattern or design. After development of the resin, chemical and/or dry etching (for example plasma-assisted etching) etches the material of the preliminary layer 1, silicon in this example, selectively relative to the silicon nitride of the sacrificial layer 2. Etching in a TMAH (tetramethyl ammonium hydroxide) solution may be used, for example. In effect, the etching speed in a TMAH solution is 2 nm/min for silicon nitride and varies from 0.4 to 0.5 µm/min for silicon (with crystalline orientation <1 0 0>). Areas of interest 1A, 1B, 1C, etc. of silicon, advantageously monocrystalline silicon, are obtained in this way.

Figure 3:
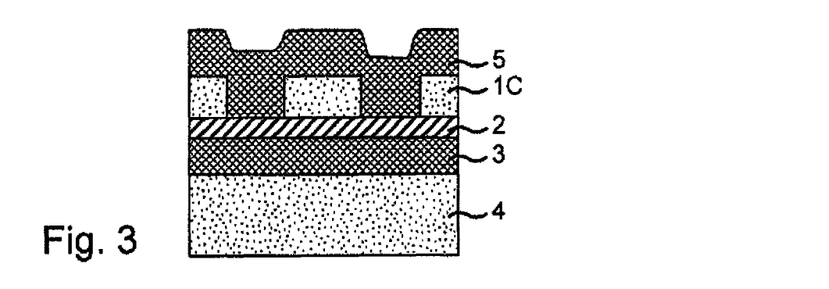
FIG. 3 is a diagrammatic view of a third fabrication step, making use of a deposition of oxide, for example.
Figure 11:
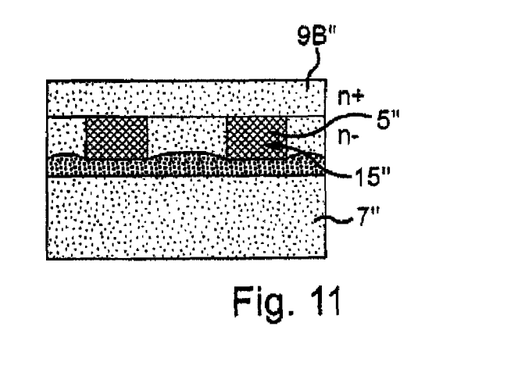
FIG. 11 is a diagrammatic view of a further mixed structure.

It is also possible, at this stage, to modify the properties of the silicon layer, for example in terms of doping (see FIG. 11).

c) Filling of Surface Areas Between the Areas of Interest (FIG. 3)

Figure 4:
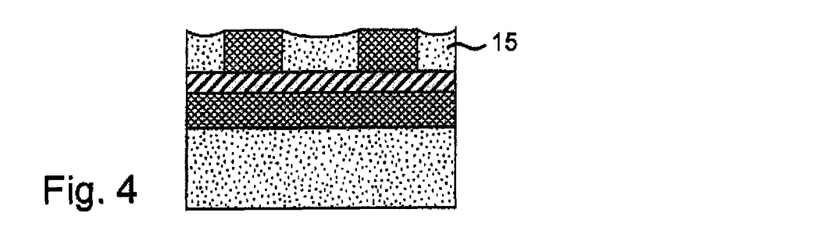
FIG. 4 is a diagrammatic view of a fourth fabrication step, making use of polishing.

All known deposition techniques may be considered here. This filling can be effected by depositing a material that is advantageously an insulative material, for example silicon oxide. This material can advantageously have sufficient etching selectivity relative to the sacrificial layer at its interface with that layer, especially if the sacrificial layer 2 is removed in the step g) by etching. This deposition step 5 continues until the spaces between the areas 1A to 1C are filled.

d) Polishing (FIG. 4)

As a function of the material deposited beforehand, appropriate polishing conditions can be applied. Polishing is effected at least until the areas 1A, 1B and 1C are bared.

As described hereinabove, this polishing causes differences in level to appear. They are exaggerated in FIG. 4, but as will emerge later, these differences in level are not a problem for the production of the final structure. After polishing, the areas 1A, 1B and 1C in fact form first patterns, non-insulative in this example, defining conjointly with the second patterns formed by the remainder of the layer 5 (consequently referred to as patterns 5), which are insulative in this example, a mixed layer denoted 15.

e) Deposition on the Mixed Layer of a Thin Planarization Layer (FIG. 5)

Figure 6:
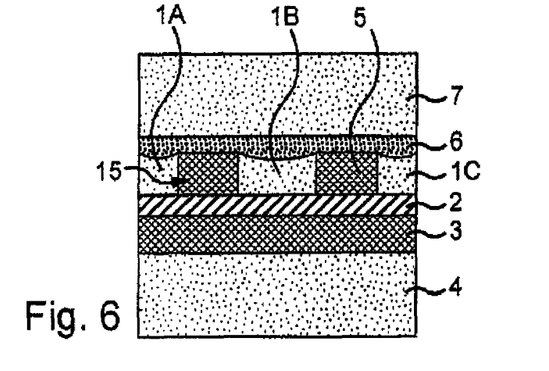
FIG. 6 is a diagrammatic view of a sixth fabrication step, making use of direct bonding.

The polished surface obtained at the end of the step represented by FIG. 4, with differences in level, is covered with a planarization layer 6 by any appropriate known technique. This can advantageously be a layer of polycrystalline silicon, for example, which can be obtained by CVD or LPCVD, for example, or a metallic layer obtained by an evaporation or sputtering technique. A standard polishing process is then applied to this homogeneous polysilicon (polycrystalline silicon) layer or metal layer to make it compatible with bonding (next step).

f) Bonding onto the Planarization Layer of a Support Substrate (FIG. 6)

The assembly of an additional wafer 7 called a support substrate, for example a silicon wafer, to the assembly from FIG. 5 can be obtained by direct bonding following an optional preliminary step of preparing the surfaces to be assembled (which can include CMP polishing steps and steps of cleaning in appropriate known chemical solutions, in particular to activate the surfaces chemically).

Figure 7:
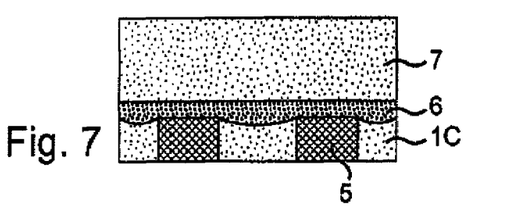
FIG. 7 is a diagrammatic view of a seventh fabrication step, making use of selective attack.

Heat treatment to strengthen the direct bonding can advantageously be effected.

g) Elimination of the Starting Substrate and the Sacrificial Layer (FIG. 7)

Several solutions for this purpose are possible, including the following techniques.

First of all, the starting support substrate 4 may have been implanted beforehand (like the wafer that yielded the preliminary thin layer 1), so that fracture annealing can detach most of the silicon substrate 4 (as early as the FIG. 1 stage, provided that it is possible thereafter to manipulate the assembly from FIGS. 2 to 6 or afterwards). In this case, the thin residual silicon layer and the oxide layer 3 can be etched selectively, for example in a TMAH solution and an HF solution, respectively. The nitride layer can then in turn be etched, for example in a solution of phosphoric acid (H3PO4) at 120° C.

If the wafer has not been implanted, the starting substrate can be removed by mechanical thinning (grinding) and/or chemical attack. Nowadays thinning equipment achieves a removal accuracy of a few micrometers for 200 mm diameter silicon wafers. In order not to damage the nitride layer, mechanical thinning can advantageously stop a few micrometers above the interface with the nitride. As in the first case, chemical etching in TMAH and HF etching remove the silicon and the residual oxide. The nitride layer is then etched in a solution of H3PO4.

In another variant, it is possible for the suitable substrate from FIG. 1 to include a demounting area to enable the removal of the starting substrate and the sacrificial layer, associated with an etching step or not, for example by the application of mechanical forces, in particular by the insertion of a blade into this demounting area. The demounting area can be obtained by the intentional and controlled production of a relatively weak bonding interface between the sacrificial layer and the starting substrate and/or between the sacrificial layer and the preliminary layer, for example.

Figure 8:
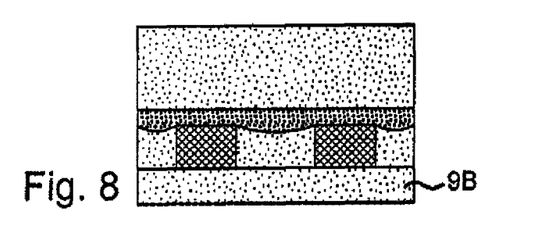
FIG. 8 is a diagrammatic view of an eighth fabrication step, yielding a mixed structure.

The mixed surface freed after removal of the sacrificial layer is plane: it features no differences in level, no relief. It is compatible in terms of flatness with direct bonding. It would be possible at this stage, if required, to etch a portion of the mixed layer provided that the etching method used preserves a surface flatness compatible with direct bonding.

h) Transfer of a Covering Layer onto the Bared Face of the Mixed Layer (FIG. 8)

A covering layer 9B, for example of silicon, can then be transferred onto the bared mixed surface.

Once again, several techniques are possible for carrying out this step.

For example, a new silicon wafer 9, called the covering wafer, can be direct bonded onto the freed mixed surface, after appropriate preparation of the faces to be assembled. This wafer 9 can then be thinned to leave on the mixed layer only the covering layer 9B.

Figure 9:
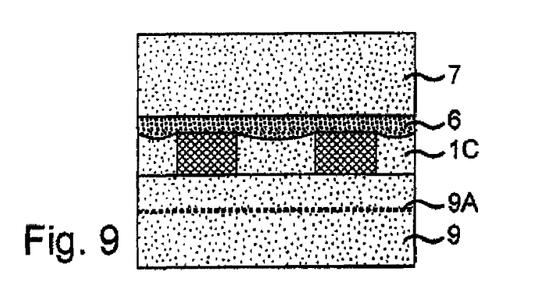
FIG. 9 is a diagrammatic view of an optional substep of the eighth fabrication step, making use of direct bonding and weakening by implantation.

This thinning can be produced by CMP polishing, for example, or, as shown in FIG. 9, by fracture along a buried weak area 9A, formed beforehand in the wafer 9, for example by implantation of gaseous species (in particular hydrogen). This preserves a layer 9B of the wafer 9, forming the covering layer, the thickness whereof is very well controlled.

By transferring the silicon covering layer 9B, a partial SOI is obtained with areas containing patterns of insulator (SiO2 for example) and areas with no insulator, advantageously of monocrystalline material, for example of silicon (entirely appropriate for the formation of vertical components).

Figure 10:
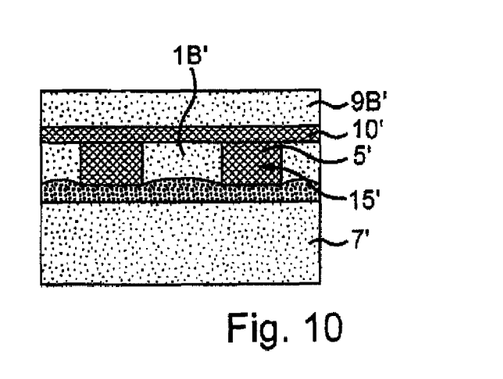
FIG. 10 is a diagrammatic view of another mixed structure.

If the silicon covering layer 9B includes at its interface with the mixed layer an insulative interface layer, for example of oxide, advantageously a thermal oxide, a mixed SOI is obtained with different thicknesses of buried insulative material. FIG. 10 shows such a mixed SOI structure, the insulative interface layer carrying the reference 10' (in this FIG. 10, the reference numbers designating elements analogous to those of FIG. 8 are derived from the reference numbers of that FIG. 8 by adding the "prime" index).

Advantages Over Previous Solutions

The polishing of the mixed areas, for example Si/SiO2 areas, taking place on the face of the mixed layer opposite that in contact with the covering layer 9B has no impact on the quality of the bond between the insulative patterns 5 and the covering layer 9B. Consequently, the polishing conditions can remain the same for the entire range of thicknesses and sizes of the oxide areas 5.

Polishing conditions (abrasives and polishing cloths) can even be chosen that lead to a high Si/SiO2 selectivity, and oxide layers can be used as polishing stop layers.

The invention produces a mixed layer featuring monocrystalline areas. Those areas can advantageously be used, given their mechanical and/or physical and/or chemical properties, for example to produce pillars for suspended structures produced in the covering layer 9B (MEMS application, for example).

It is known that fabrication by bonding an SOI substrate with a thin buried oxide is difficult, because the impurities present at the bonding interface cannot all be adsorbed by the thin oxide layer. In the mixed SOI configuration (see FIG. 10 referred to above), it is possible to use two different oxides. The thermal first oxide 10' provides the electrical properties while oxide areas 5' can be of lower density deposited oxide. The impurities present at the bonding interface can then be expected to be adsorbed by the oxide areas as indicated in the PCT Publication No. WO-2004/059711 cited above.

The covering layer 9B", for example of silicon, can have a crystalline orientation or a doping different from those of the silicon areas 1A, 1B, and the like. situated between the insulative patterns 5. The bonding interface is close to the surface. It is therefore possible (see FIG. 11, in which elements similar to those of FIG. 8 are designated by reference numbers that are derived from the reference numbers of that FIG. 8 by addition of the "second" index) to integrate an n+ doped silicon layer directly onto the n−silicon areas (or vice-versa). In this configuration certain components can be produced without modification of the doping during fabrication (diode production application in particular).

The silicon areas are of crystalline quality and the components (not shown) can be produced directly on this portion of the silicon. Moreover, the silicon covering layer can have a crystalline orientation different from that of the oxide areas (Hybrid Orientation Technology (HOT)).

It is entirely possible to employ different materials and to produce different configurations (thicknesses, size of areas) without significantly modifying the process parameters.

The polysilicon layer 6 can be replaced by a metallic layer for certain applications (in particular for good heat dissipation). For the circuits or components produced on the SOI areas (Si/SiO2) the metallic layer limits the effect of penetration of the field lines into the substrate (ground plane). The principle of the ground plane is to place an equipotential under the buried oxide.

If the support substrate 7 has at least a layer of silicon at the surface, the material of the planarization layer 6 can advantageously be chosen to form, after appropriate heat treatment (known as siliciding treatment) an alloy with some or all of the surface silicon, thereby favoring in particular adhesion between the planarization layer and the support substrate.

All layer transfers are compatible with the Smart Cut™ process. Thus each silicon wafer can be recycled and consumed progressively, layer by layer.

All the direct bonding can be effected on the same equipment.

It should be noted that, according to the invention, polishing defects are covered with a layer that, after polishing, is bonded directly to a substrate, as in the U.S. Pat. No. 5,691,231 cited above. It must nevertheless be clearly understood that the quality of this bonding and the fact that the edges of the oxide patterns can here be imperfectly coplanar is much less important than in respect of the bonding interface 1C+5/10 in FIG. 10, because that bonding interface is much closer to the free surface of the mixed structure assembly obtained.

The case cited above employs homogeneous layers for the most part (planarization layer, support substrate, filler layer, covering layer, and the like) but it is clear that all these layers can consist of a stack of different materials (in terms of composition and/or doping and/or crystalline orientation, and the like) or even localized and different according to the areas of the same surface.

The case cited above uses silicon for the most part for the various layers or patterns (possibly in the form of oxides or nitrides) but one benefit of the invention is being able to employ different materials to produce the mixed layer, in particular insulative materials chosen from thermal and/or deposited SiO2, Si3N4, Al2O3, AlN, SiC and other insulative materials, associated with non-insulative materials, which are advantageously monocrystalline materials, such as doped silicon, silicon germanium, germanium, (III-V) materials (InP, GaAs, GaN, etc.), and the like.

It is equally possible to use various materials for the planarization layer, in particular metals chosen from Ni, Pd, Co, Pt, W and/or alloys of those metals, for example with silicon.

The invention can advantageously be employed to obtain the benefit of the mixed electrical properties of the structure obtained. It can equally be used to obtain the benefit of the mix of chemical and/or mechanical and/or optical and/or thermal properties obtained within the mixed layer.

It enables the use of a wide variety of materials on either side of the mixed layer. For example, there may be cited semiconductor materials such as silicon but also SiGe, GaAs, GaN, InP and other materials from groups (III-V) or (II-VI) or insulative materials such as SiO2, Si3N4, Al2O3, AlN. As already mentioned, these layers can be composite layers. For example, for applications in photonics, there can be provision for disposing on either side of the mixed layer stacks forming mirrors, for example two-layer mirrors (SiO2, Si3N4) or (SiO2, Si).

The invention claimed is:

1. A method of fabricating a mixed microtechnology structure, the method comprising:
    providing a provisional substrate including a sacrificial layer on which is formed a mixed layer including at least first patterns of a first material and second patterns of a second material different from the first material, wherein the first and second patterns reside adjacent the sacrificial layer,
    wherein providing a provisional substrate further comprises:
        providing a starting substrate including the sacrificial layer and a continuous preliminary layer;
        lithographically forming cavities in the preliminary layer from a face of the preliminary layer that is opposite the sacrificial layer, the cavities extending as far as the sacrificial layer;
        filling the cavities with the second material to form the second patterns and to form the mixed surface;
        forming a layer of planarization material on the mixed surface;
        polishing the layer of planarization material to have a continuous plane surface; and
        assembling a support substrate of a fourth material by bonding a surface of the support substrate to the continuous plane surface of the layer of planarization material;
    removing the sacrificial layer and exposing a mixed surface of the mixed layer, the mixed surface including portions of the first patterns and portions of the second patterns; and
    forming a continuous covering layer of a third material on the mixed surface by direct bonding.

2. The method according to claim 1, wherein at least one of the first and second materials comprises a monocrystalline material.

3. The method according to claim 1, wherein the first material comprises an electrically non-insulative material, wherein the second material comprises an electrically insulative material, and wherein the third material comprises an electrically non-insulative material.

4. The method according to claim 1, wherein the first patterns and the continuous covering layer include a common element.

5. The method according to claim 4, wherein the common element comprises silicon.

6. The method according to claim 1, wherein the continuous covering layer and the first patterns include a dopant, wherein a doping level of the continuous covering layer differs from a doping level of the first patterns.

7. The method according to claim 1, wherein the second patterns comprise an oxide of an element common with the first patterns.

8. The method according to claim 7, wherein the oxide comprises an oxide of silicon.

9. The method according to claim 8, wherein the sacrificial layer and the second patterns respectively include a nitride and an oxide of an element common with the first patterns of the mixed layer.

10. The method according to claim 1, wherein the sacrificial layer comprises a nitride.

11. The method according to claim 1, wherein the continuous covering layer and the first patterns comprise silicon.

12. The method according to claim 1, wherein the method further comprises forming an insulative interface layer on the mixed surface before forming the continuous covering layer or forming an insulative interface layer on the continuous covering layer.

13. The method according to claim 12, wherein forming the insulative interface layer comprises surface oxidation of the continuous covering layer.

14. The method according to claim 12, wherein forming the insulative interface layer and providing the second patterns comprises forming oxides of silicon, and wherein providing the first patterns comprises providing silicon.

15. The method according to claim 1, wherein assembling a support substrate of a fourth material to the continuous plane surface of the layer of planarization material comprises direct bonding.

16. The method according to claim 15, wherein providing the starting substrate comprises providing a starting substrate that further includes an intermediate support substrate.

17. The method according to claim 16, wherein providing the starting substrate comprises providing a starting substrate that further includes an insulative layer between the intermediate support substrate and the sacrificial layer, and wherein the insulative layer comprises an oxide of an element of the intermediate support substrate.

18. The method according to claim 16, further comprising implanting the intermediate support substrate with gaseous species or ions to form a weakened layer along a layer parallel to the sacrificial layer.

19. The method according to claim 18 further comprising after assembling the support substrate by direct bonding the support substrate to the layer of planarization material, separating the intermediate support substrate along the weakened layer.

20. The method according to claim 15, wherein providing the continuous preliminary layer comprises bonding to the sacrificial layer a preliminary substrate formed by a separation along a weakened layer of the substrate.

21. The method according to claim 15, wherein filling the cavities comprises filling by vapor deposition.

22. The method according to claim 15, wherein the mixed surface is obtained by polishing the second material to bare portions of the preliminary layer between cavities.

23. The method according to claim 15, wherein the planarization layer comprises a polycrystalline layer of a material common with the first patterns.

24. The method according to claim 15, wherein forming a layer of planarization material comprises forming a metallic layer.

25. The method according to claim 20, wherein the support substrate comprises a material included in the first patterns.

26. A method of fabricating a mixed microtechnology structure, the method comprising:
    providing a provisional substrate including a sacrificial layer on which is formed a mixed layer including at least first patterns of a first material and second patterns of a second material different from the first material, wherein the first and second patterns reside adjacent the sacrificial layer;
    wherein providing a provisional substrate further comprises:
        providing a starting substrate including the sacrificial layer and a continuous preliminary layer comprising silicon;
        lithographically forming cavities in the continuous preliminary layer from a face of the preliminary layer that is opposite the sacrificial layer, the cavities extending to only a portion of the thickness of the continuous preliminary layer;
        thermally oxidizing the remaining thickness of the continuous preliminary layer until the sacrificial layer is reached and filling the cavities to form the second patterns and to form the mixed surface;
        forming a layer of planarization material on the mixed surface;
        polishing the layer of planarization material to have a continuous plane surface; and
        assembling a support substrate of a fourth material by bonding a surface of the support substrate to the continuous plane surface of the layer of planarization material;
    removing the sacrificial layer and exposing a mixed surface of the mixed layer, the mixed surface including portions of the first patterns and portions of the second patterns; and
    forming a continuous covering layer of a third material on the mixed surface by direct bonding.

27. The method according to claim 26, wherein providing the starting substrate includes providing a nitride layer on the silicon preliminary layer, and wherein lithographically forming the cavities extends through the nitride layer.

28. The method according to claim 26, wherein filling the cavities comprises thermal oxidation.

* * * * *

UNITED STATES PATENT AND TRADEMARK OFFICE
CERTIFICATE OF CORRECTION

PATENT NO. : 7,947,564 B2  
APPLICATION NO. : 11/857130  
DATED : May 24, 2011  
INVENTOR(S) : Marek Kostrzewa et al.

Page 1 of 1

It is certified that error appears in the above-identified patent and that said Letters Patent is hereby corrected as shown below:

On the Title Page

Left column, after item (22), insert item (30) as follows:

--Foreign Application Priority Data

September 19, 2006    (FR)    0653820--.

Signed and Sealed this  
Twenty-second Day of November, 2011

David J. Kappos  
*Director of the United States Patent and Trademark Office*